(12) United States Patent
Onishi et al.

(10) Patent No.: US 11,501,980 B2
(45) Date of Patent: Nov. 15, 2022

(54) SEMICONDUCTOR MODULE, METHOD FOR MANUFACTURING SEMICONDUCTOR MODULE, AND LEVEL DIFFERENT JIG

(71) Applicant: FUJI ELECTRIC CO., LTD., Kanagawa (JP)

(72) Inventors: Kazunaga Onishi, Matsumoto (JP); Takashi Masuzawa, Matsumoto (JP); Hiromichi Gohara, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 16/830,297

(22) Filed: Mar. 26, 2020

(65) Prior Publication Data
US 2020/0365419 A1    Nov. 19, 2020

(30) Foreign Application Priority Data

May 15, 2019 (JP) .............................. JP2019-092306

(51) Int. Cl.
*H01L 23/46* (2006.01)
*H01L 21/48* (2006.01)
*H01L 25/07* (2006.01)
*H01L 25/18* (2006.01)

(52) U.S. Cl.
CPC ...... *H01L 21/4882* (2013.01); *H01L 21/4803* (2013.01); *H01L 23/46* (2013.01); *H01L 25/072* (2013.01); *H01L 25/18* (2013.01)

(58) Field of Classification Search
CPC .............................. H01L 23/473; H01L 23/46
See application file for complete search history.

(56) References Cited

U.S. PATENT DOCUMENTS

| | | | |
|---|---|---|---|
| 5,379,942 A | 1/1995 | Kuhnert | |
| 2006/0157862 A1* | 7/2006 | Nishimura | H05K 3/3463 257/772 |
| 2012/0279761 A1* | 11/2012 | Hori | H01L 23/3735 228/122.1 |
| 2013/0264702 A1* | 10/2013 | Nishi | H01L 23/3735 257/712 |
| 2015/0021756 A1* | 1/2015 | Adachi | H01L 23/473 257/714 |
| 2015/0041187 A1 | 2/2015 | Hori | |
| 2016/0099194 A1* | 4/2016 | Gohara | H01L 25/18 257/712 |
| 2017/0271240 A1* | 9/2017 | Inoue | H01L 25/18 |

(Continued)

FOREIGN PATENT DOCUMENTS

| | | | |
|---|---|---|---|
| JP | H06315925 A | 11/1994 | |
| JP | H07169781 A | 7/1995 | |
| JP | H08293525 A | 11/1996 | |

(Continued)

*Primary Examiner* — Benjamin P Sandvik

(57) ABSTRACT

A method for manufacturing a fin-integrated semiconductor module includes: clamping a fin-integrated heat-dissipation base using a level different jig while making the heat-dissipation base vary in height; and soldering a semiconductor assembly onto the heat-dissipation base. A semiconductor module includes a fin-integrated heat-dissipation base and a semiconductor assembly provided on the heat-dissipation base. A bending width of the heat-dissipation base is 200 μm or less.

22 Claims, 16 Drawing Sheets

(56) References Cited

U.S. PATENT DOCUMENTS

2017/0278770 A1\* 9/2017 Kato .................. H01L 23/3677

FOREIGN PATENT DOCUMENTS

| JP | H0982844 A | 3/1997 |
| JP | 2005072369 A | 3/2005 |
| JP | 2005294792 A | 10/2005 |
| JP | 2006202884 A | 8/2006 |
| JP | 2010221250 A | 10/2010 |
| JP | 2013197246 A | 9/2013 |
| JP | 2015153925 A | 8/2015 |
| JP | 2015170825 A | 9/2015 |
| JP | 2015170826 A | 9/2015 |
| JP | 2016167548 A | 9/2016 |
| WO | 2013141110 A1 | 9/2013 |

\* cited by examiner

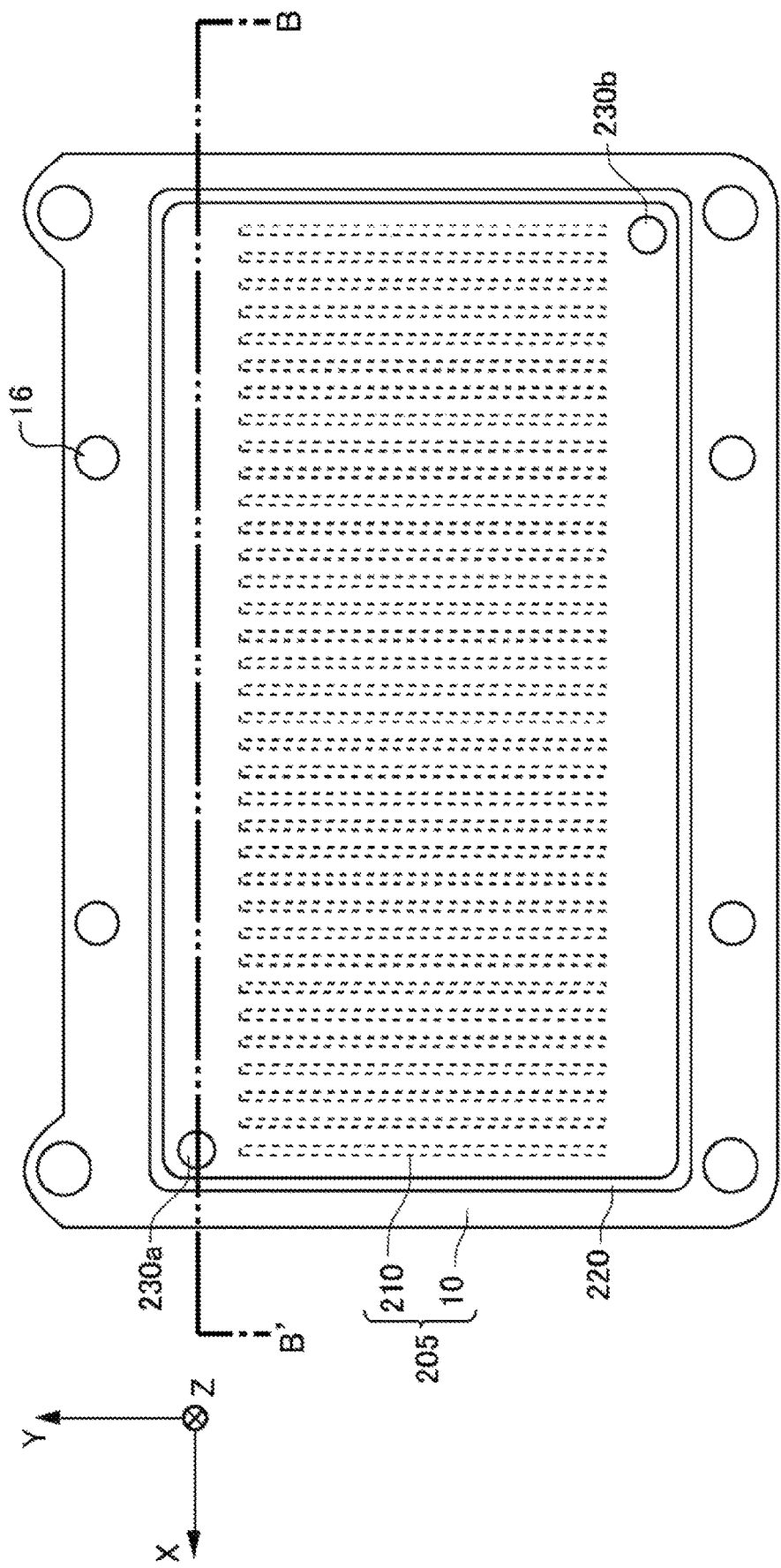

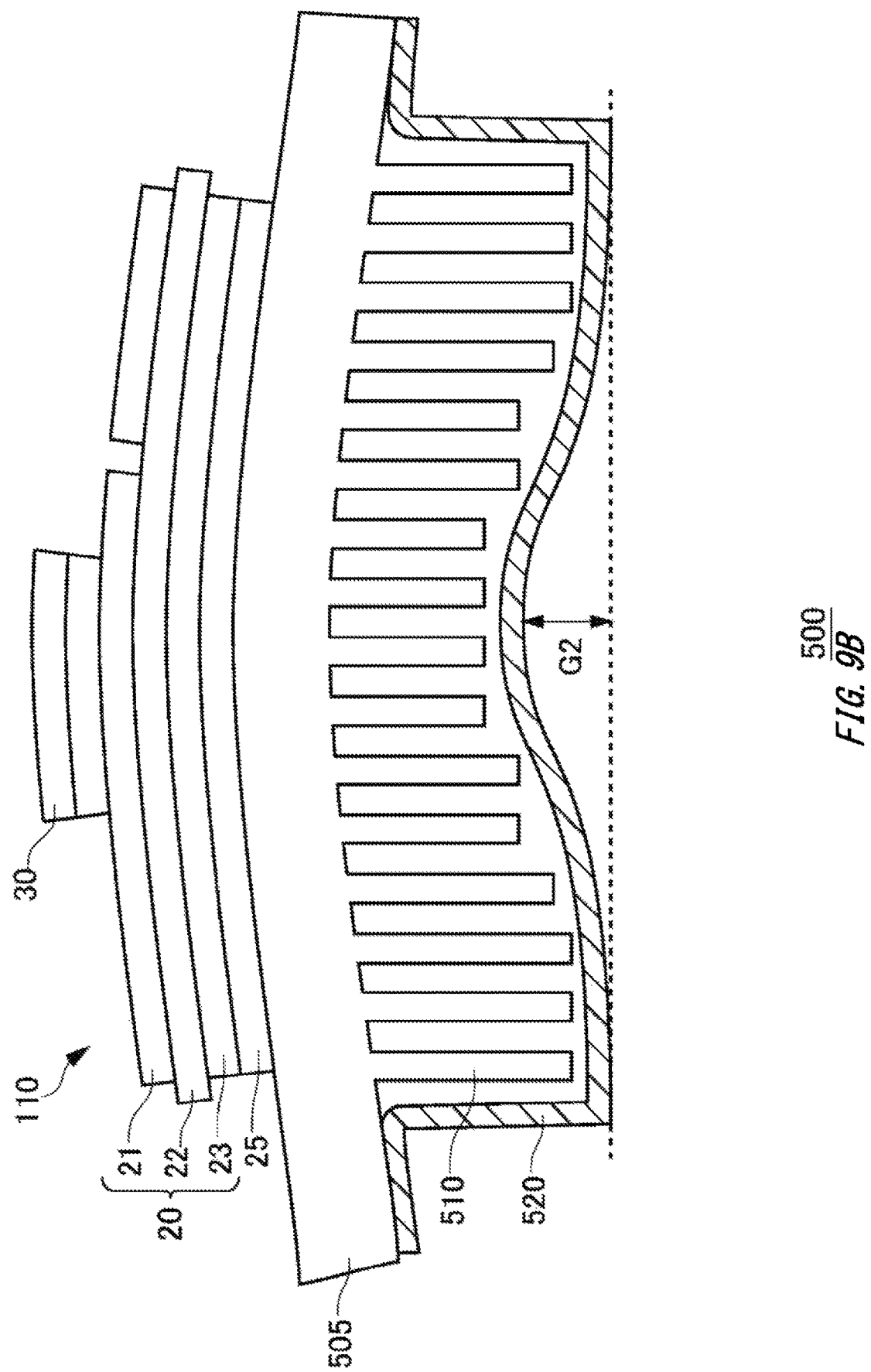

SEMICONDUCTOR MODULE, METHOD FOR MANUFACTURING SEMICONDUCTOR MODULE, AND LEVEL DIFFERENT JIG

The contents of the following Japanese patent application(s) are incorporated herein by reference:
NO. 2019-092306 filed in JP on May 15, 2019.

BACKGROUND

1. Technical Field

The present invention relates to a semiconductor module, a method for manufacturing a semiconductor module, and a level different jig.

2. Related Art

Conventionally, to reduce bending of a heat-dissipation base of a semiconductor module, a method has been known in which a pressing jig having a curved surface is used to preliminarily clamp the heat-dissipation base into a curved shape (see, e.g., patent documents 1 and 2). Patent document 1: Japanese Unexamined Patent Application Publication No. 2015-153925. Patent document 2: Japanese Unexamined Patent Application Publication No. 2013-197246.

SUMMARY

However, it is difficult to process and maintain the conventional pressing jig of the curved shape.

A first aspect of the present invention provides a method for manufacturing a fin-integrated semiconductor module. The method for manufacturing a semiconductor module includes: clamping a fin-integrated heat-dissipation base using a level different jig while making the heat-dissipation base vary in height; and soldering a semiconductor assembly onto the heat-dissipation base.

The clamping of the heat-dissipation base may include fixing a plurality of first clamped portions of the heat-dissipation base at a first height, and fixing a second clamped portion at a second height lower than the first height. The plurality of first clamped portions are arranged in a longitudinal direction of the heat-dissipation base. The second clamped portion is interposed between the plurality of first clamped portions in the longitudinal direction.

The clamping may include: providing a first jig of the level different jig; placing the heat-dissipation base on the first jig; and coupling the first jig and a second jig of the level different jig to each other to fix the heat-dissipation base at the first height and the second height.

The clamping may include clamping the heat-dissipation base by point-pressurization. The heat-dissipation base may include the plurality of first clamped portions and the second clamped portion that are fixed by the level different jig, and a free portion not fixed by the level different jig.

The clamping may include clamping the heat-dissipation base by plane-pressurization. The heat-dissipation base may include the plurality of first clamped portions and the second clamped portion that are fixed by the level different jig, and a plane-pressurized portion clamped by plane-pressurization using the second jig.

The method for manufacturing a semiconductor module may further include positioning and placing an insulating substrate on the heat-dissipation base using the second jig.

The method for manufacturing a semiconductor module may include, prior to the soldering of the semiconductor assembly, attaching a cooling case configured to accommodate cooling fins to the heat-dissipation base.

The heat-dissipation base may have a same linear expansion coefficient as the level different jig.

A second aspect of the present invention provides a semiconductor module including a fin-integrated heat-dissipation base and a semiconductor assembly. The semiconductor assembly is provided on the heat-dissipation base. A bending width of the heat-dissipation base is 200 μm or less.

The semiconductor module may further include a cooling case and coolant channels. The cooling case is configured to accommodate cooling fins. The coolant channels include openings provided in the cooling case and are configured to run coolant inside of the cooling case via the openings. Assuming that an imaginary plane passes through a first end portion and a second end portion of the heat-dissipation base, the second end portion on a side opposite to the first end portion side in a longitudinal direction of the heat-dissipation base, a center axis of each of the openings may be deviated from a perpendicular line to the imaginary plane by 5 degrees or less.

A third aspect of the present invention provides a level different jig configured to manufacture a semiconductor module. The level different jig includes a first jig and a second jig. A heat-dissipation base of the semiconductor module is placed on the first jig. The second jig is configured to be coupled to the first jig so as to clamp the heat-dissipation base. The first jig may include first protrusions and a second protrusion. The first protrusions are configured to position a plurality of first clamped portions of the heat-dissipation base at a first height. The plurality of first clamped portions are arranged in a longitudinal direction of the heat-dissipation base. The second protrusion is configured to position a second clamped portion at a second height lower than the first height. The second clamped portion is interposed between the plurality of first clamped portions in the longitudinal direction. The second jig may include first couplers and a second coupler. The first couplers are configured to be coupled to the first protrusions so as to clamp the plurality of first clamped portions at the first height. The second coupler is configured to be coupled to the second protrusion so as to clamp the second clamped portion at the second height.

The summary clause of the invention does not necessarily describe all necessary features of the embodiments of the present invention. The present invention may also be a sub-combination of the features described above.

BRIEF DESCRIPTION OF THE DRAWINGS

FIG. 1C is an exemplary bottom view of the semiconductor module 100.

FIG. 9B is an exemplary cross-sectional view of the semiconductor module 500 manufactured by a method according to another comparative example.

DESCRIPTION OF EXEMPLARY EMBODIMENTS

The present invention will now be described using embodiments of the invention. The following embodiments are not to limit the present invention according to the appended claims. All combinations of features described in the embodiments are not necessarily essential to solutions provided by the present invention.

Figure 1A:
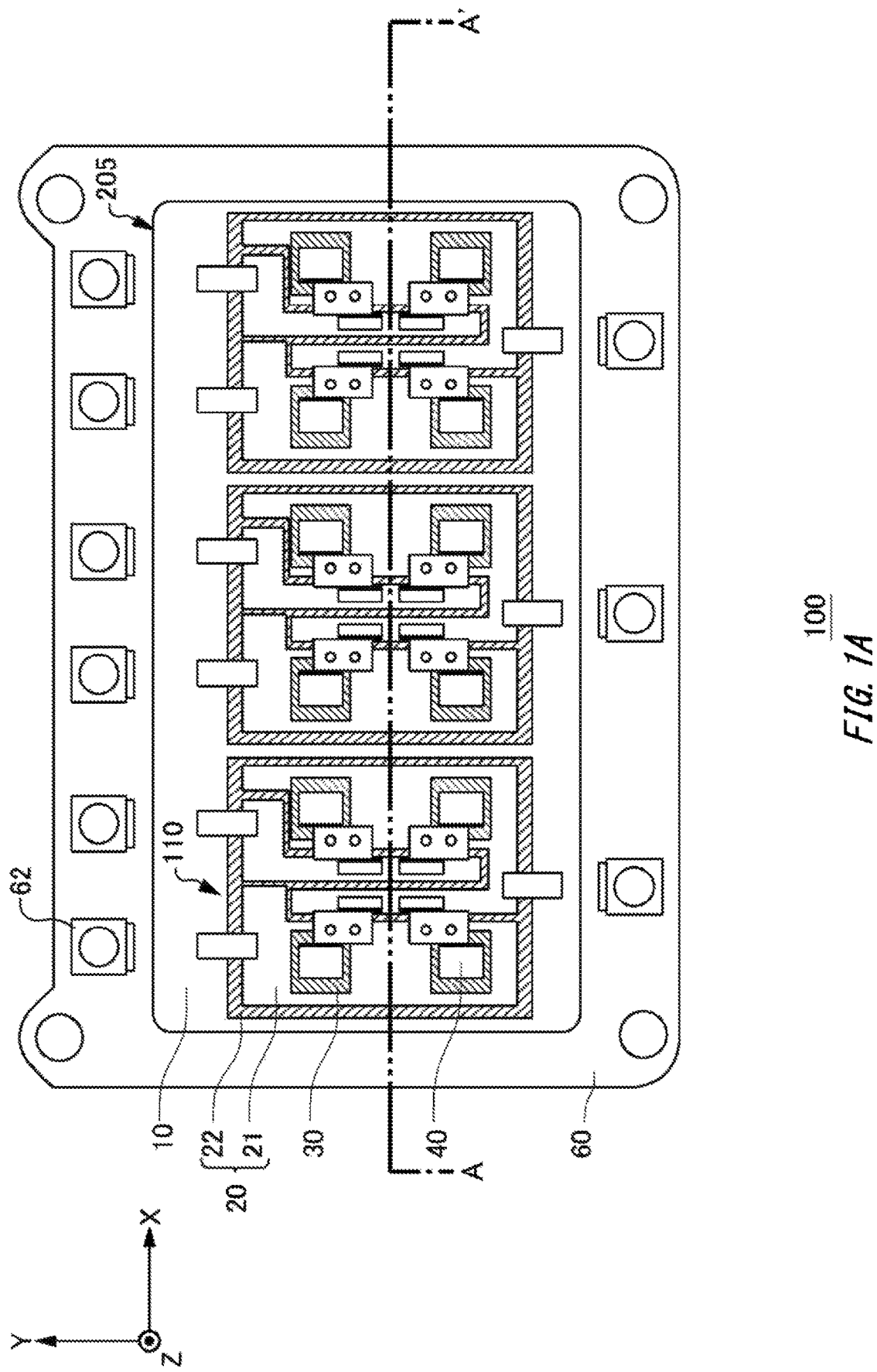
FIG. 1A is an exemplary plan view of a semiconductor module 100 according to an example of the present invention.

FIG. 1A is an exemplary plan view of a semiconductor module 100 according to an example of the present invention. In the plan view of FIG. 1A, a longitudinal direction of a rectangular casing 60 is referred to as "X-axis", and a lateral direction of the casing 60 is referred to as "Y-axis". A Z-axis, along with the X-axis and the Y-axis, constitutes a right-handed coordinate system.

The semiconductor module 100 includes a heat-dissipation base 10, the casing 60, and semiconductor assemblies 110. The semiconductor module 100 according to this example includes the three semiconductor assemblies 110.

The casing 60 is a terminal case made of resin. The casing 60 defines a region to accommodate the semiconductor assemblies 110 and surrounds the semiconductor assemblies 110 in the plan view.

A fin-integrated base 205 includes the heat-dissipation base 10 and cooling fins 210, described later. The fin-integrated base 205 has a fin-integrated configuration in which the heat-dissipation base 10 and the cooling fins 210 are integrally formed. In this specification, the semiconductor module 100 including the fin-integrated heat-dissipation base 10 will be referred to as "fin-integrated semiconductor module". Preliminary bending of the fin-integrated heat-dissipation base 10 prior to reflow can reduce bending of the fin-integrated semiconductor module 100 as a finished product.

Figure 1B:
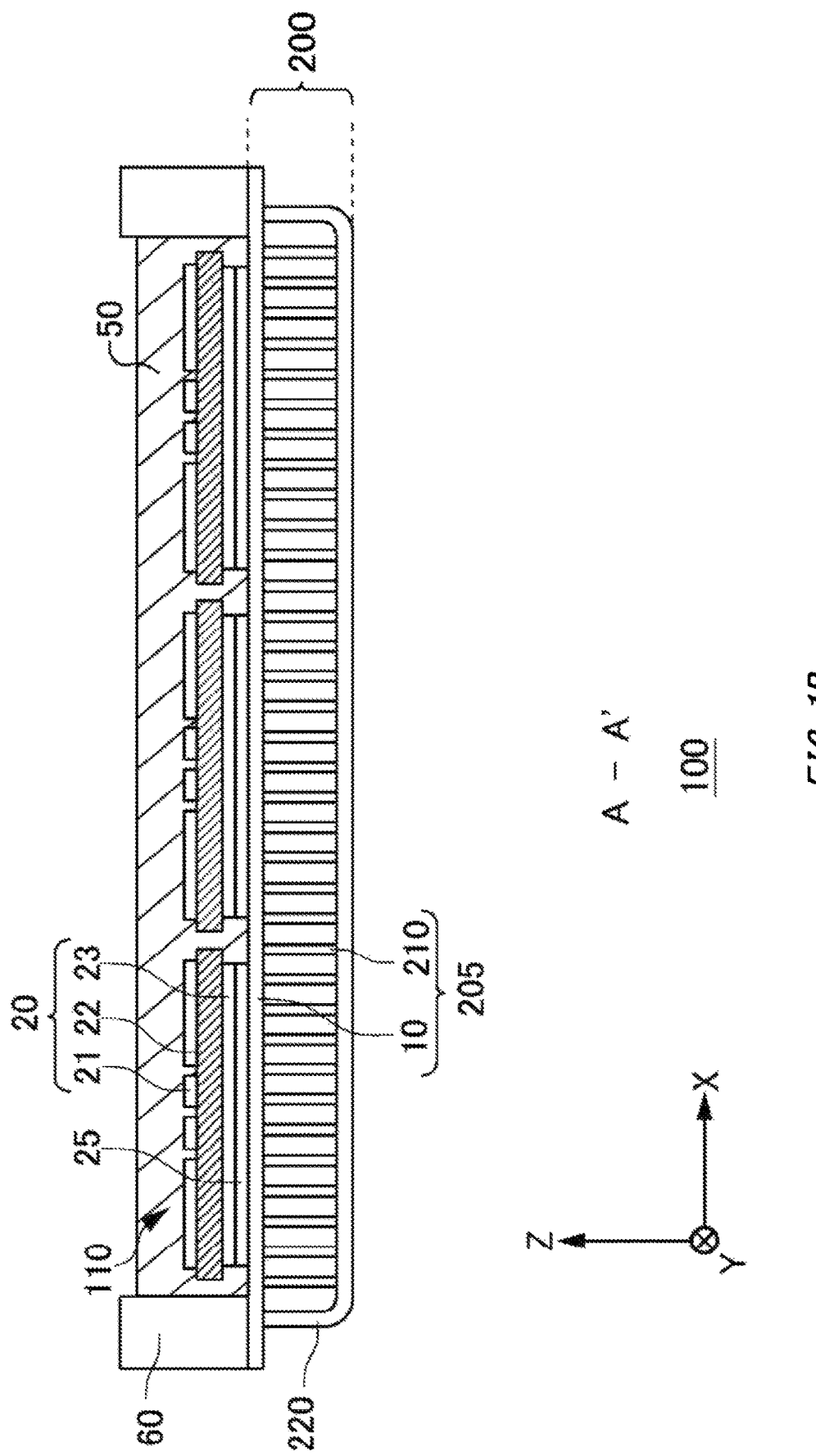
FIG. 1B is a view of an exemplary cross-section taken along line A-A' in FIG. 1A.

The heat-dissipation base 10 is provided on a lower surface side of the semiconductor module 100. The heat-dissipation base 10 may be a flat metal plate having a plane parallel to an X-Y plane. The heat-dissipation base 10 is made of, for example, a metal material containing aluminum or copper. The heat-dissipation base 10 overlaps the casing 60 in the plan view. As can be seen in FIG. 1B, the heat-dissipation base 10 is of uniform thickness. As can be seen in FIG. 1B, the thickness of the portion of the heat-dissipation base 10 covering the cooling fins 210 and the thickness of the portion of the heat-dissipation base 10 covering the sidewalls of the cooling case 220 are the same.

The semiconductor assemblies 110 are mounted on an upper surface of the heat-dissipation base 10. The semiconductor assemblies 110 are fixed to the upper surface of the heat-dissipation base 10 by a bonding material such as solder. Thus, heat generated by the semiconductor assemblies 110 is transmitted to the heat-dissipation base 10. The three semiconductor assemblies 110 according to this example are disposed side by side in the X-axis direction, namely, the longitudinal direction. This example, however, should not be construed in a limiting sense. Each of the semiconductor assemblies 110 is an assembly including an insulating substrate 20 and semiconductor chips 30.

The insulating substrate 20 is soldered on the heat-dissipation base 10. The insulating substrate 20 may be a direct copper bonding (DCB) substrate or an active metal brazing (AMB) substrate. The insulating substrate 20 includes a conductive plate 21 and an insulating plate 22.

The insulating plate 22 is made of an insulative material such as ceramic. The insulating plate 22 is made of, for example, alumina ($Al_2O_3$) or aluminum nitride (AlN) or silicon nitride ($Si_3N_4$).

The conductive plate 21 is a wiring pattern provided on an upper surface of the insulating plate 22. The conductive plate 21 is made of, for example, a metal material, such as copper or copper alloy. The conductive plate 21 is bonded to the semiconductor chips 30 by soldering. Thus, the conductive plate 21 is electrically connected to the semiconductor chips 30. In the semiconductor assembly 110, the semiconductor chips 30, the conductive plate 21, and metal wiring boards 40 may be electrically connected to constitute a half bridge circuit.

Each of the semiconductor chips 30 may be a vertical power semiconductor element including at least one of a transistor and a diode. In one example, the semiconductor chip 30 is a metal oxide semiconductor field effect transistor (MOSFET) or an insulated gate bipolar transistor (IGBT). The semiconductor chip 30 may be a reverse conducting-IGBT (RC-IGBT) having an IGBT and a freewheeling diode (FWD) formed on the single chip. The semiconductor chip 30 may be formed of a semiconductor substrate of silicon, silicon carbide, gallium nitride or the like. Each of the three semiconductor assemblies 110 according to this example includes two pairs of the semiconductor chips 30, i.e., four semiconductor chips 30.

The metal wiring boards 40 are electrically connected to the semiconductor chips 30. For example, collectors or emitters of the semiconductor chips 30 are wired via the metal wiring boards 40. One end of each of the metal wiring boards 40 may be connected to an electrode of the semiconductor chip 30 through solder. The other end of the metal wiring board 40 may be connected to an external connection terminal to be connected to the outside of the semiconductor module 100. The metal wiring board 40 may be a conductive connecting member formed of a metal plate by processing such as presswork. The metal plate may be a plate of copper or copper alloy. The metal wiring board 40 may have a film of nickel, for example, plated on a surface thereof. A cross-section (Z-X cross-section) of the metal wiring board 40 may have a rectangular portion.

It should be noted that the casing 60 includes a plurality of main terminals 62. The main terminals 62 include a U-phase terminal, a V-phase terminal, and a W-phase terminal to respectively drive a U-phase, a V-phase, and a W-phase in a three-phase inverter circuit, for example. The main terminals 62 also includes a power source terminal to supply power to the three-phase inverter circuit, for example.

FIG. 1B is a view of an exemplary cross-section taken along line A-A' in FIG. 1A. The A-A' cross-section is an X-Z cross-section passing through the casing 60 and the semiconductor assemblies 110. The semiconductor module 100 includes a cooling portion 200.

The cooling portion 200 is disposed below the semiconductor assemblies 110. Coolant may be supplied to the cooling portion 200 from the outside. The cooling portion 200 runs the coolant to cool the semiconductor module 100. The cooling portion 200 includes the fin-integrated base 205 and a cooling case 220. The semiconductor chips 30 in operation generate heat, which is dissipated to the outside of the semiconductor module 100 through the cooling portion 200 and the coolant.

The cooling fins 210 form a plurality of passages where the coolant flows. The cooling fins 210 extend in the Z-axis direction. One end of each of the cooling fins 210 on a positive side of the Z-axis is connected to a lower surface of the heat-dissipation base 10. One end of the cooling fin 210 on a negative side of the Z-axis may be in contact with an upper surface of the cooling case 220. A plurality of cooling fins 210 are disposed at desired intervals in the X-axis direction. Examples of the cooling fins 210 may include not be straight fins, a wave-shaped fin, pin fins, a corrugated fin, or stacked fins. The cooling fins 210 may be made of a metal having the same composition as the cooling case 220. The cooling fins 210 are made of, for example, a metal containing aluminum or copper. A material of the cooling fins 210 may be a metal containing aluminum to reduce the weight.

The heat-dissipation base 10 has a configuration integral to the cooling fins 210. That is, the heat-dissipation base 10 is coupled to the cooling fins 210. In one example, the fin-integrated heat-dissipation base 10 is manufactured by forming fins by a technique, such as cutting, brazing, presswork, forging, implanting, and caulking. With the fin-integrated configuration, it is difficult to control bending as compared with a heat-dissipation base of a single plate. Similarly, in some cases, when the fin-integrated heat-dissipation base 10 is preliminarily bent, manufacturing the fin-integrated heat-dissipation base 10 itself may become difficult or impossible.

The cooling case 220 accommodates the cooling fins 210. The cooling case 220 covers lower surfaces and side surfaces of the cooling fins 210. Upper surfaces of the cooling fins 210 are covered with the heat-dissipation base 10. The cooling case 220 may be made of the same material as the heat-dissipation base 10. The cooling case 220 may be a box-shaped component having a bottom plate and side walls. The cooling case 220 may include a flange coupled to the side walls. The flange may be bonded to the heat-dissipation base 10.

The insulating substrate 20 is soldered on the heat-dissipation base 10 with under-substrate solder 25. The insulating substrate 20 includes the conductive plate 21, the insulating plate 22, and a conductive plate 23.

The conductive plate 23 is provided on a lower surface of the insulating plate 22. The conductive plate 21 and the conductive plate 23 are made of, for example, a conductive metal material, such as copper or copper alloy. The conductive plate 23 is provided on the substantially whole lower surface of the insulating plate 22.

Encapsulating resin 50 encapsulates the interior of the casing 60. The encapsulating resin 50 encloses the semiconductor assemblies 110. The encapsulating resin 50 may be one of epoxy resin and silicone gel. A lower surface of the encapsulating resin 50 may be in contact with the upper surface of the heat-dissipation base 10. Side surfaces of the encapsulating resin 50 may be in contact with the casing 60. An upper surface of the encapsulating resin 50 is below an upper surface of the casing 60.

The cooling case 220 and the cooling fins 210 may be formed by presswork, forging or extrusion molding. The cooling case 220 and the cooling fins 210 may be assembled by brazing. A brazing material may be made of a metal having a lower melting point than the cooling case 220. As the metal having a low melting point for the brazing material, a metal containing copper or aluminum may be used.

FIG. 1C is an exemplary bottom view of the semiconductor module 100. On the lower surface side of the semiconductor module 100, openings 16 for attaching a level different jig, described later, are formed in the heat-dissipation base 10.

Inside of the cooling case 220, the cooling fins 210 extend in the Y-axis direction and are provided along in the X-axis direction. According to this example, the cooling fins 210 are straight fins having a rectangular strip shape a longitudinal direction of which is the Y-axis direction. The number and shape of the cooling fins 210 are not limited to this example.

Coolant channels 230 are provided in the lower surface of the cooling case 220. The coolant channels 230 allow coolant to flow inside of the cooling case 220. In one example, the coolant enters the cooling case 220 from the coolant channel 230a and flows outside of the cooling case 220 from the coolant channel 230b. The coolant channel 230a and the coolant channel 230b are provided in end portions of the cooling case 220 in the longitudinal direction. However, the coolant channel 230a and the coolant channel 230b may be provided in the vicinity of the center of the cooling case 220. As can be seen in FIG. 1C, the bottom plate of the cooling case 220 is rectangular, each of the first opening 230a and the second opening 230b is provided in a corresponding corner portion of the bottom plate of the cooling case 220, and the corresponding corner portion of the bottom plate corresponding to the first opening 230a is located diagonally across from the corresponding corner portion of the bottom plate corresponding to the second opening 230b.

Figure 1D:
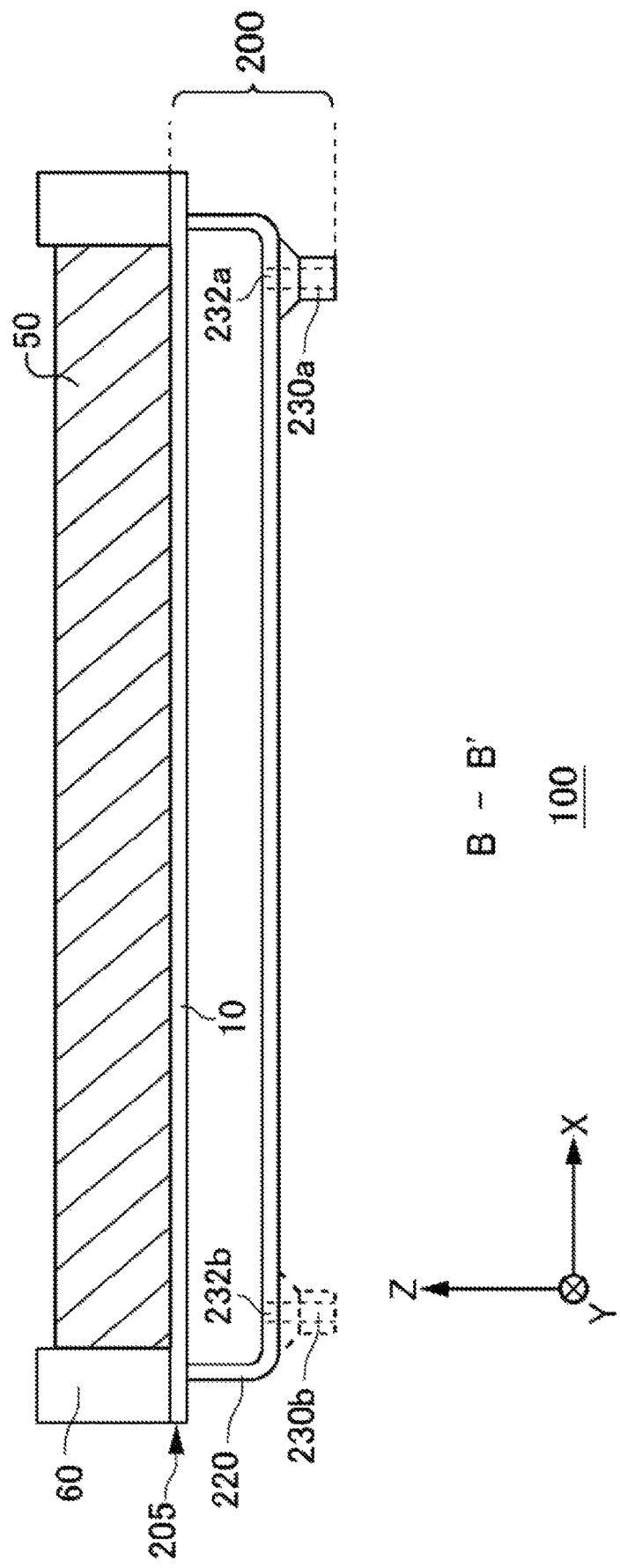
FIG. 1D is a view of an exemplary cross-section taken along line B-B' in FIG. 1C.

FIG. 1D is a view of an exemplary cross-section taken along line B-B' in FIG. 1C. The B-B' cross-section is an X-Z cross-section passing through the coolant channel 230a. The coolant channels 230 includes the coolant channel 230a and the coolant channel 230b.

The coolant channel 230a is coupled to an external apparatus, for example, and allows the coolant to enter the cooling case 220. The coolant channel 230a has an opening 232a to allow the coolant to flow therein.

The coolant channel 230b is coupled to the external apparatus, for example, and allows the coolant to flow outside of the cooling case 220. The coolant channel 230b has an opening 232b to allow the coolant to flow out. The coolant may circulate between the external apparatus and the cooling portion 200.

The coolant channels 230 have a configuration protruding from the lower surface of the cooling case 220. The coolant channels 230 may each include a flange or a pipe to be coupled to the external apparatus. In order to insert the coolant channels 230 in openings in the external apparatus, the coolant channels 230 are manufactured at angles that coincide with angles of the openings in the external apparatus. In some cases, however, when the heat-dissipation base 10 is bent, the angles of the coolant channels 230 may be inclined so that the coolant channels 230 cannot be coupled to the external apparatus. In particular, when the coolant channels 230 have a protruding configuration such as a flange and a pipe, the coolant channels 230 are more liable to be misaligned being affected by bending of the heat-dissipation base 10. It should be noted that the bending of the heat-dissipation base 10 may be regarded as bending of the fin-integrated base 205 considering an influence to the cooling fins 210.

Figure 2A:
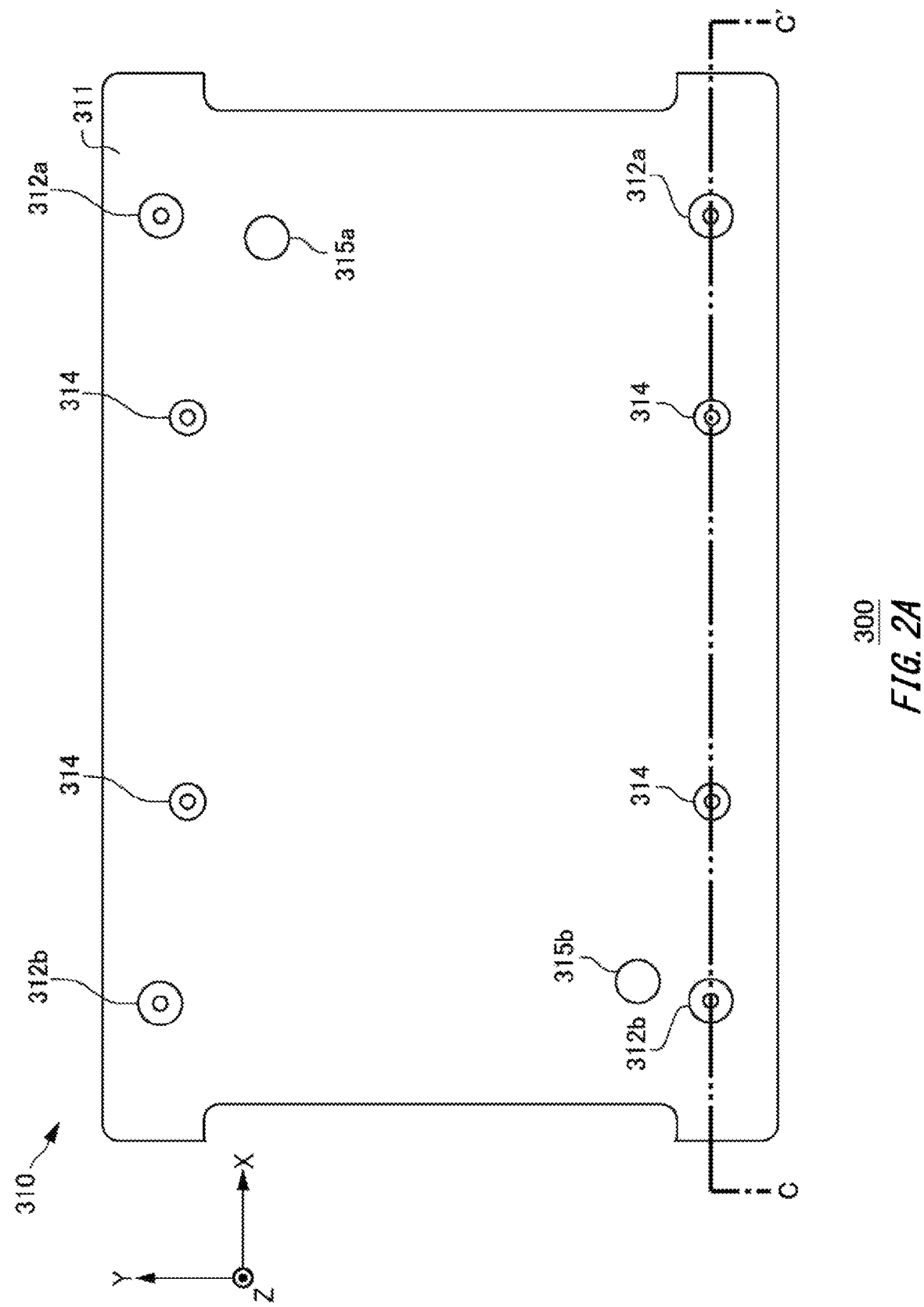
FIG. 2A is an exemplary plan view of a first jig 310.

FIG. 2A is an exemplary plan view of a first jig 310. The first jig 310 is an example of the level different jig 300.

The first jig 310, on which the heat-dissipation base 10 is placed, is used to clamp the heat-dissipation base 10 while making the heat-dissipation base 10 vary in height. The first jig 310 includes a main body 311, protrusions 312, and protrusions 314. The first jig 310 according to this example includes the four protrusions 312 and the four protrusions 314.

The protrusions 312 are provided on an upper surface of the first jig 310. The protrusions 312 extend in the Z-axis direction from an upper surface of the main body 311. The protrusions 312 position the heat-dissipation base 10 at a predetermined first height T1. Each of the protrusions 312a and each of the protrusions 312b are provided in a longitudinal direction of the heat-dissipation base 10. The protrusions 312a and the protrusions 312b is an example of the first protrusions to fix the heat-dissipation base 10 at the first height T1. The protrusions 312 each may include an internal thread for sandwiching and clamping the heat-dissipation base 10.

The protrusions 314 are provided on the upper surface of the first jig 310. The protrusions 314 extend in the Z-axis direction from the upper surface of the main body 311. The protrusions 314 position the heat-dissipation base 10 at a second height T2 lower than the first height T1. The protrusions 314 is an example of the second protrusion to fix the heat-dissipation base 10 at the second height T2. The protrusions 314 may each include an internal thread for sandwiching to clamp the heat-dissipation base 10. The protrusions 314 may be interposed between each of the protrusions 312a and each of the protrusions 312b in the longitudinal direction of the heat-dissipation base 10.

It should be noted that a heat transfer member such as a carbon sheet may be provided on the upper surface of the first jig 310. The heat transfer member on the first jig 310 enhances heat transfer from the first jig 310 to the semiconductor assemblies 110 at the time of reflow. The main body 311 may be a flat plate having the principal plane, and may also include counter bores 315 to accommodate the coolant channels 230. The counter bore 315a is formed at a position corresponding to the coolant channel 230a. The counter bore 315b is formed at a position corresponding to the coolant channel 230b.

Figure 2B:
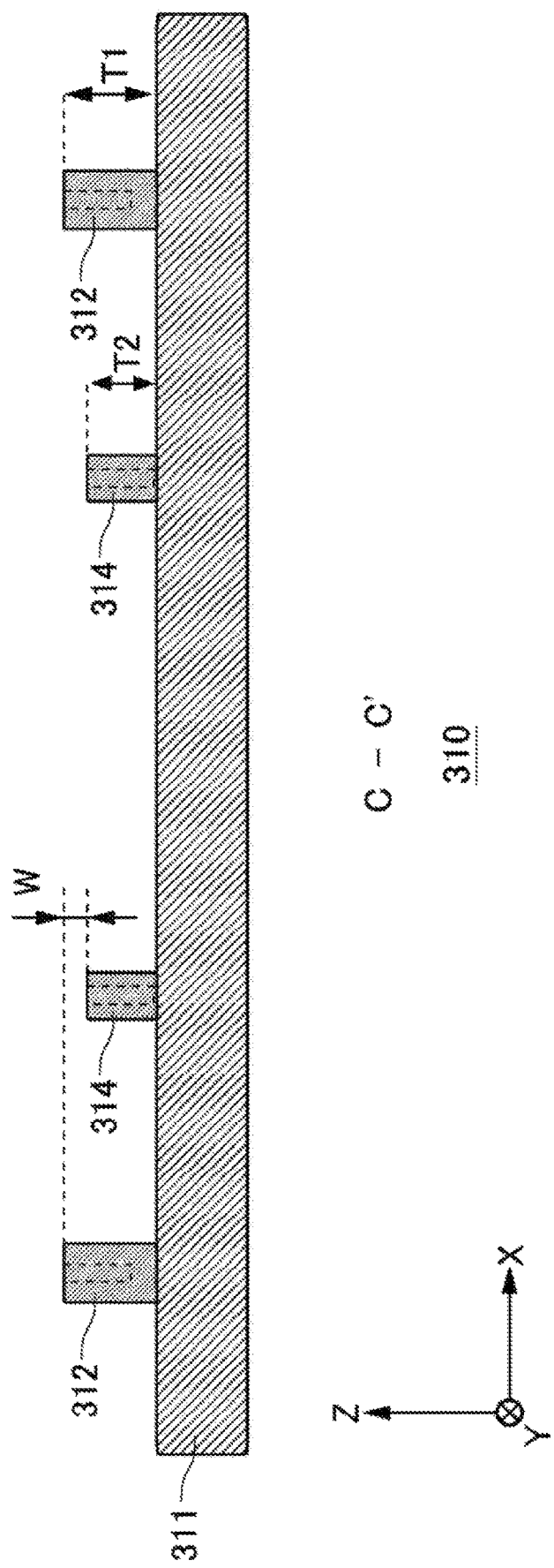
FIG. 2B is a view of an exemplary cross-section taken along line C-C' in FIG. 2A.

FIG. 2B is a view of an exemplary cross-section taken along line C-C' in FIG. 2A. The C-C' cross-section is an X-Z cross-section passing through the protrusions 312 and the protrusions 314 of the first jig 310.

The first height T1 is a height of the protrusions 312. The second height T2 is a height of the protrusions 314. The second height T2 is lower than the first height T1. The second height T2 is determined in accordance with heights of the cooling fins 210 and the cooling case 220. For example, the second height T2 is set at such a height that the cooling fins 210 can be in contact with the main body 311. Alternatively, the second height T2 may be set at such a height that the cooling case 220 can be in contact with the main body 311.

A bending width W is a difference between the first height T1 and the second height T2. The first jig 310 includes the protrusions 312 and 314 having different heights so that the first jig 310 has a difference in level corresponding to the bending width W. Based on the bending width W, a bending width of the heat-dissipation base 10 is adjusted. The level different jig 300 preliminarily bends the heat-dissipation base 10 in a direction reverse to a direction of bending at the time of reflow so as to reduce bending of the heat-dissipation base 10 after the reflow. The bending width W is adjusted to decrease bending width of the heat-dissipation base 10 after the reflow. In one example, the bending width W may be adjusted in accordance with a difference between linear expansion coefficients of the heat-dissipation base 10 and the insulating substrate 20. In another possible example, the bending width W may be adjusted in accordance with shapes of the heat-dissipation base 10 and the insulating substrate 20. For example, the bending width W is 0.2 mm or greater and 2.0 mm or less.

Figure 3:
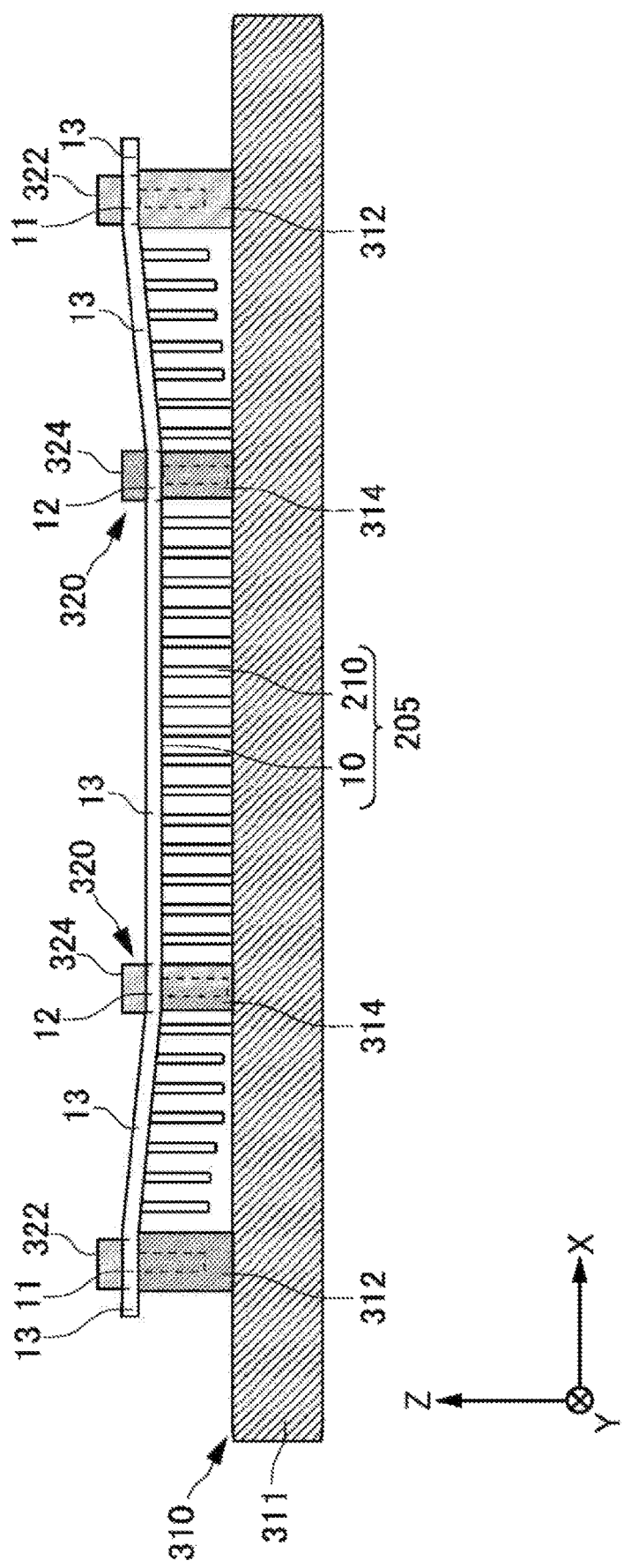
FIG. 3 is an exemplary side view of a heat-dissipation base 10 clamped by point-pressurization.

FIG. 3 is an exemplary side view of the heat-dissipation base 10 clamped by point-pressurization. The side view illustrates a state of the heat-dissipation base 10 being preliminarily bent. A configuration of the first jig 310 and a second jig 320 according to this example is an example of clamping the heat-dissipation base 10 by point-pressurization. This, however, should not be construed in a limiting sense. The heat-dissipation base 10 includes clamped portions 11, clamped portions 12, and free portions 13. The second jig 320 includes couplers 322 and couplers 324.

The couplers 322 are coupled to the protrusions 312 so as to clamp the heat-dissipation base 10. The couplers 322 are fixing components such as screws. For example, the couplers 322 are external screws to be inserted to the openings 16 and fitted into the internal threads of the protrusions 312. The clamped portions 11 are point-pressurized by heads of the external screws.

The couplers 324 are coupled to the protrusions 314 so as to clamp the heat-dissipation base 10. The couplers 324 are fixing components such as screws. For example, the couplers 324 are external screws to be inserted to the openings 16 and fitted into the internal threads of the protrusions 314. The clamped portions 12 are point-pressurized by heads of the external screws.

The clamped portions 11 are positioned at the first height T1 by the protrusions 312. The clamped portions 11 are regions clamped by the protrusions 312 and the couplers 322. That is, the clamped portions 11 are held by both the protrusions 312 and the couplers 322.

The clamped portions 12 are positioned at the second height T2 by the protrusions 314. The clamped portions 12 are regions clamped by the protrusions 314 and the couplers 324. That is, the clamped portions 12 are held by both the protrusions 314 and the couplers 324. The clamped portions 12 are interposed between the plurality of clamped portions 11 in the longitudinal direction of the heat-dissipation base 10. Thus, the heat-dissipation base 10 can have a curved shape with higher opposite ends and a lower center in the longitudinal direction of the heat-dissipation base 10.

The free portions 13 are regions of the heat-dissipation base 10 that are not fixed by the level different jig 300. That is, the free portions 13 are not in contact with the first jig 310 and the second jig 320. However, the free portions 13 are indirectly fixed with the clamped portions 11 and the clamped portions 12 being clamped at different heights.

Figure 4A:
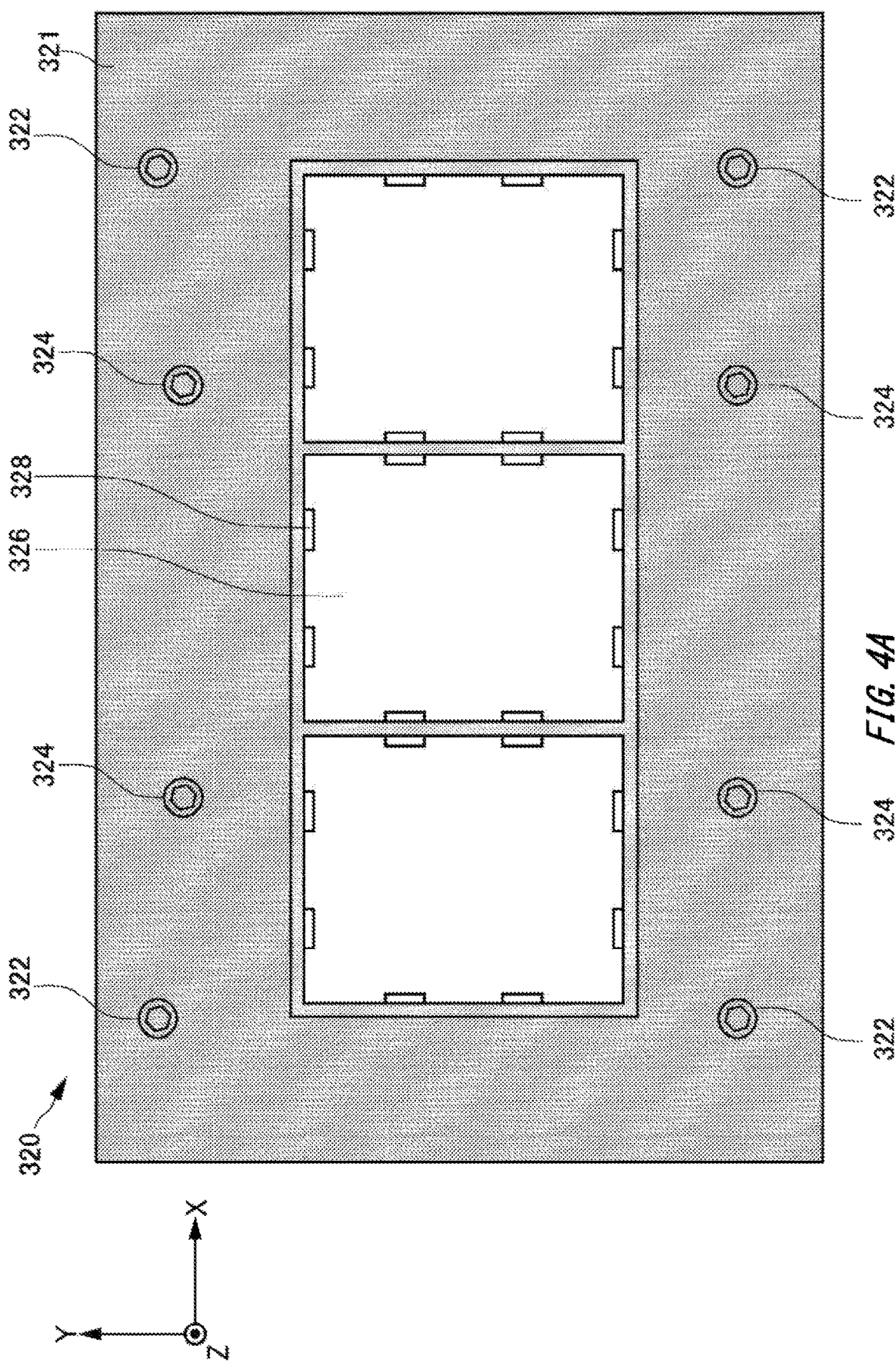
FIG. 4A is an exemplary plan view of a second jig 320.

FIG. 4A is an exemplary plan view of the second jig 320. A configuration of the second jig 320 according to this example is an example of clamping the heat-dissipation base 10 by plane-pressurization.

The second jig 320 is fixed to the first jig 310 and used to place the semiconductor chips 30 on the heat-dissipation base 10. The second jig 320 includes the couplers 322 and the couplers 324 at positions corresponding to the shape of the casing 60. The second jig 320 according to this example includes the four couplers 322 and the four couplers 324.

Openings 326 position the semiconductor assemblies 110 when the semiconductor assemblies 110 are placed on the heat-dissipation base 10. The second jig 320 according to this example has the three openings 326. That is, the second jig 320 according to this example also serves as an assembling jig to position and place the insulating substrate 20 on the heat-dissipation base 10. This enables preliminary bending of the heat-dissipation base 10 without increasing the number of jigs.

Protrusions 328 are provided in end portions of the openings 326. The plurality of protrusions 328 guide components such as the insulating substrate 20 to desired positions. The plurality of protrusions 328 can provide regions where a bonding material such as solder molten spreads between adjacent pairs of the protrusions 328 at the time of reflow. The plurality of protrusions 328 may have an inclined cross-sectional shape to guide components such as the semiconductor chips 30 to predetermined positions. The protrusions 328 may be made of, for example, a carbon material different from a material of a main body 321.

Figure 4B:
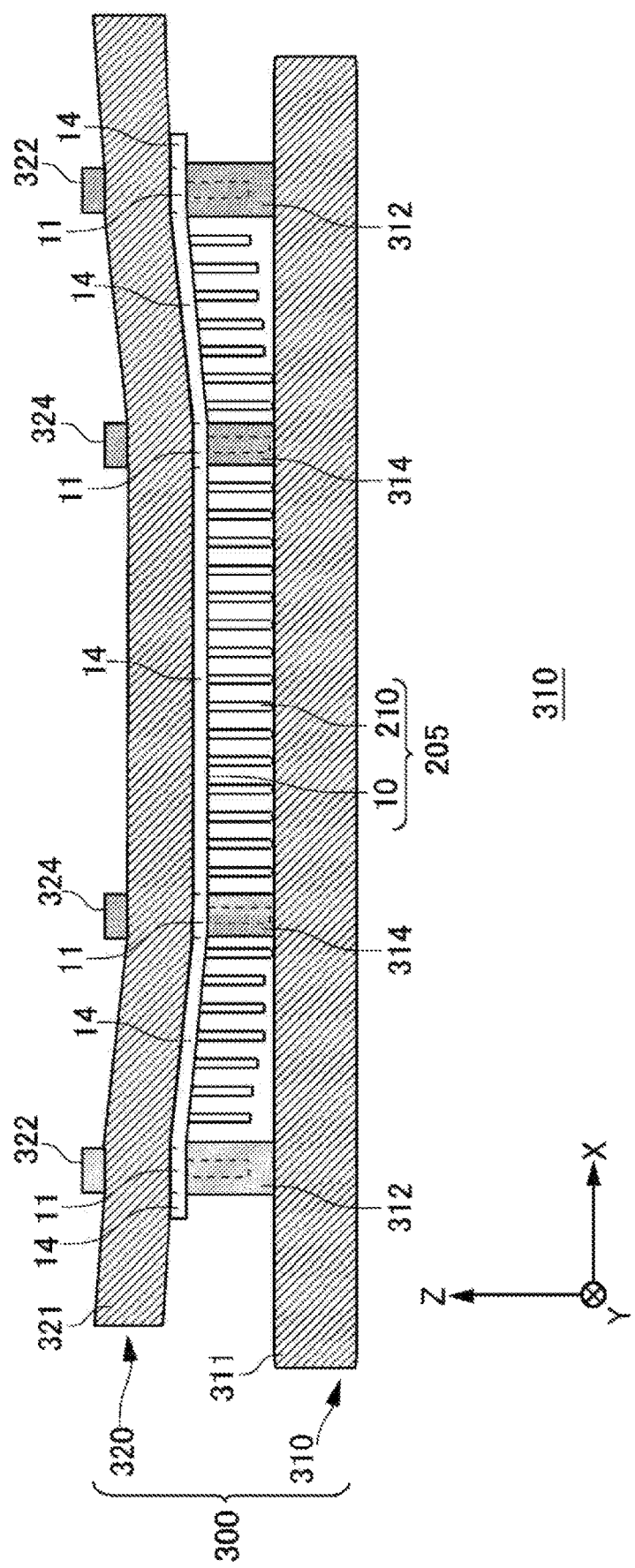
FIG. 4B is an exemplary side view of the heat-dissipation base 10 clamped by plane-pressurization.

FIG. 4B is an exemplary side view of the heat-dissipation base 10 clamped by plane-pressurization. A configuration of the first jig 310 and the second jig 320 according to this example is an example of clamping the heat-dissipation base 10 by plane-pressurization. This, however, should not be construed in a limiting sense.

The second jig 320 is coupled to the first jig 310 with the couplers 322 and the couplers 324. Thus, the main body 321 of the second jig 320 is deformed in accordance with a difference in level and plane-pressurizes the heat-dissipation base 10.

Plane-pressurized portions 14 are regions plane-pressurized by the second jig 320. That is, the plane-pressurized portions 14 are regions in contact with the main body 321 but in no contact with the first jig 310. The plane-pressurized portions 14 are pressed by the second jig 320 when the second jig 320 is coupled to the first jig 310.

The second jig 320 according to this example can clamp the heat-dissipation base 10 in a substantially curved shape without complicated processing. The second jig 320 is applicable to the heat-dissipation base 10 of various shapes and sizes.

It should be noted that the level different jig 300 may have the same linear expansion coefficient as the heat-dissipation base 10. This suppresses bending caused by a difference between linear expansion coefficients of the heat-dissipation base 10 and the level different jig 300.

Figure 5:
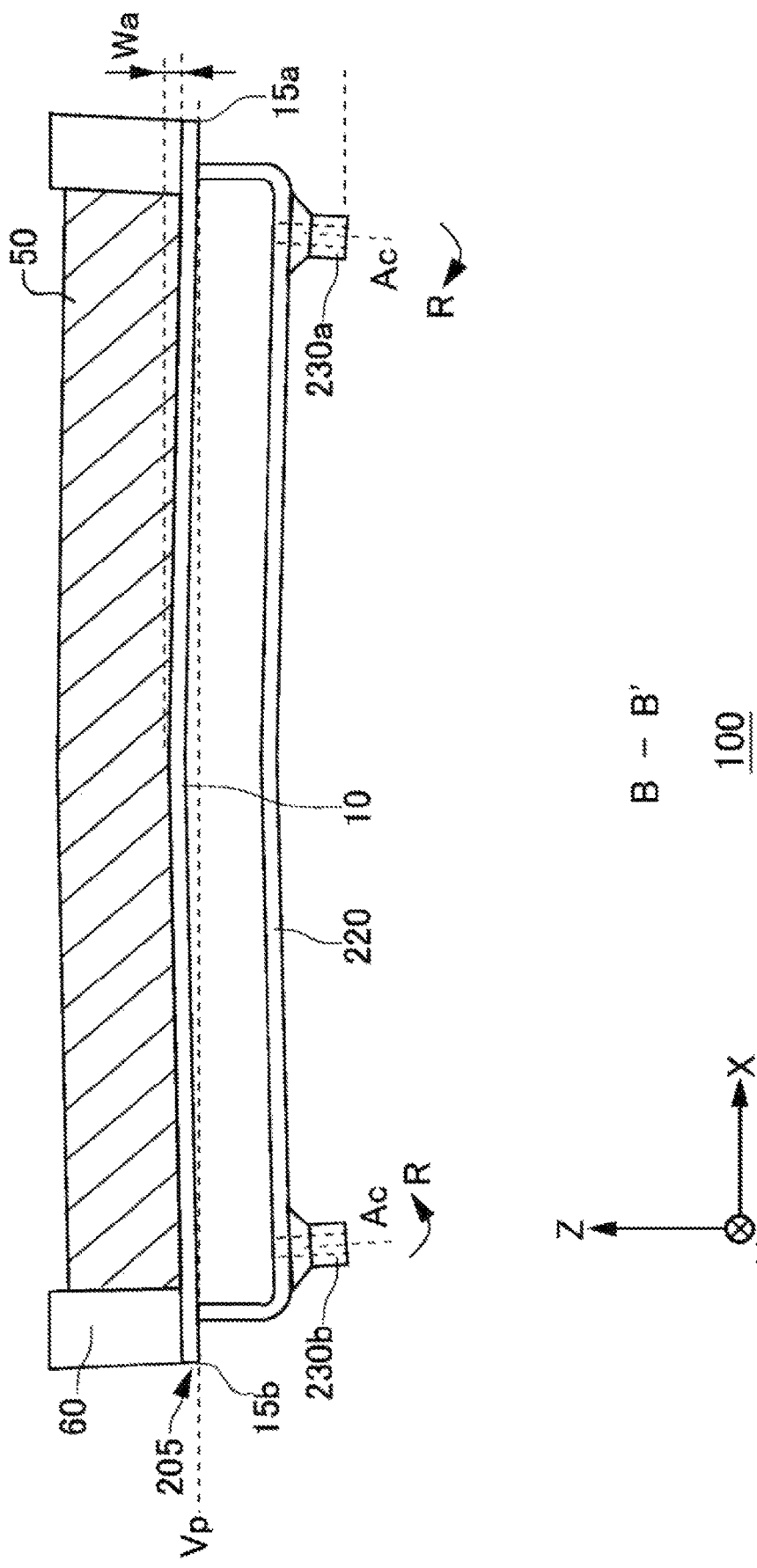
FIG. 5 is an exemplary cross-sectional view of the semiconductor module 100 after reflow.

FIG. 5 is an exemplary cross-sectional view of the semiconductor module 100 after the reflow. This exemplary cross-sectional view corresponds to the B-B' cross-section in FIG. 1C.

The heat-dissipation base 10 is flat or bent in a direction reverse to the direction of preliminary bending by the level different jig 300 prior to the reflow. That is, the heat-dissipation base 10 is deformed convexly in cross section. The cooling case 220 is similarly deformed convexly so that the coolant channels 230 are inclined inward. As can be seen in the illustrated example of FIG. 5, the cooling case 220 is deformed convexly such that the bottom plate of the cooling case 220 protrudes toward the heat-dissipation base 10. The illustrated example of FIG. 5 also shows a cooling case 220 that has a bottom plate of uniform thickness.

A bending width Wa represents bending of the heat-dissipation base 10 after the reflow. Appropriate setting of the bending width W of the level different jig 300 enables adjustment of the bending width Wa of the heat-dissipation base 10 after the reflow. The semiconductor module 100 may include the flat heat-dissipation base 10 having no bending width Wa. For example, the bending width Wa is 200 μm or less. The bending width Wa may also be 0 μm or larger.

An imaginary plane Vp passes through an end portion 15a and an end portion 15b of the heat-dissipation base 10 in the longitudinal direction. The end portion 15b is opposite to the end portion 15a in the longitudinal direction of the heat-dissipation base 10. Preferably, the heat-dissipation base 10 has a flat plane parallel to the imaginary plane Vp. The imaginary plane Vp according to this example coincides with an X-Y plane.

A bending angle R is a deviation of an angle of a center axis Ac caused by bending of the heat-dissipation base 10. The center axis Ac passes through the center of an opening of each of the coolant channels 230. Without bending, the center axis Ac is orthogonal to the imaginary plane Vp. The bending angle R is an angle of the center axis Ac with respect to a perpendicular line to the imaginary plane Vp. The bending angle R is preferably within 5 degrees.

Use of the level different jig 300 facilitates control of bending of the semiconductor module 100 and widens an allowable range of initial bending of the heat-dissipation base 10. Since control of the initial bending can lead to control of bending of the finished product, there is no need to make the heat-dissipation base 10 of high-strength material less likely to be bent. This widens a selective range of material strength of the heat-dissipation base 10.

When bending can be controlled easily, limitation by the manufacturing processes can be lessened to selectively optimize the configuration for improving cooling efficiency. As described above, by adopting the manufacturing method according to this example, the semiconductor module 100 with improved cooling efficiency can be manufactured with the level different jig 300 of a simple configuration.

Figure 6:
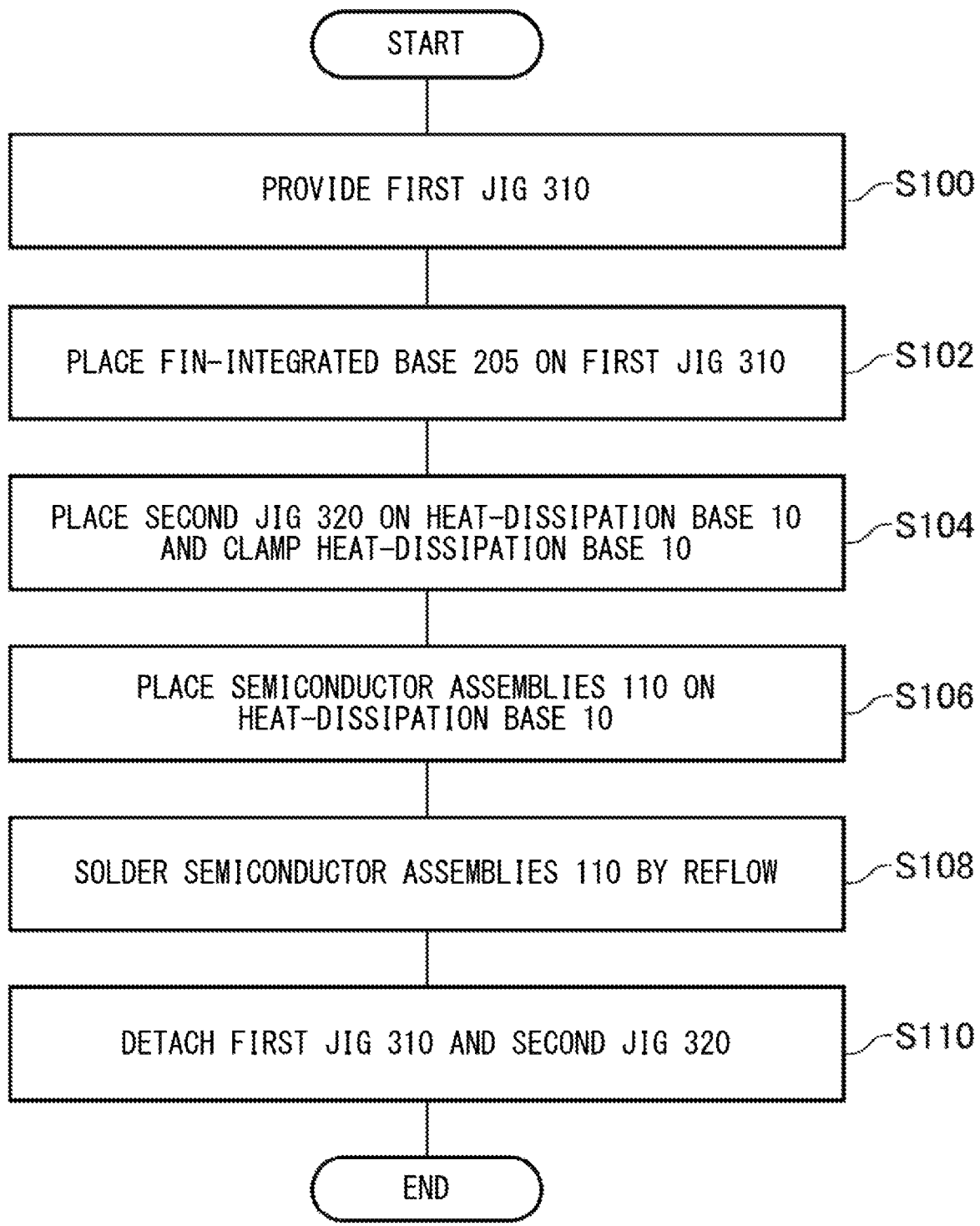
FIG. 6 illustrates an exemplary method for manufacturing the semiconductor module 100.

FIG. 6 illustrates an exemplary method for manufacturing the semiconductor module 100. Undergoing step S100 to step S110, the semiconductor module 100 can be manufactured while bending of the semiconductor module 100 as a finished product can be eliminated or minimized.

At step S100, the first jig 310 is provided. At step S102, the fin-integrated base 205 is placed on the first jig 310. When the cooling case 220 is integral to the heat-dissipation base 10, the cooling case 220 may be placed on the first jig 310.

At step S104, the first jig 310 and the second jig 320 are coupled to each other to clamp the heat-dissipation base 10 while making the heat-dissipation base 10 vary in height. The clamping the heat-dissipation base 10 while making the heat-dissipation base 10 vary in height includes a fixing the plurality of clamped portions 11 at the first height T1 and a fixing the clamped portions 12 at the second height T2. Clamping of the heat-dissipation base 10 may be performed by point-pressurization or plane-pressurization.

At step S106, the semiconductor assemblies 110 are placed on the heat-dissipation base 10. At step S106, the insulating substrate 20 may be positioned by the second jig 320 and placed on the heat-dissipation base 10. Other than the second jig 320, an assembling jig may be used to position the semiconductor assemblies 110.

At step S108, reflow is performed to solder the semiconductor assemblies 110. The semiconductor module 100 undergoes the reflow with the first jig 310 and the second jig 320 being attached. That is, the reflow is performed with the heat-dissipation base 10 being clamped. It should be noted that prior to the step of soldering the semiconductor assemblies 110, the cooling case 220 to accommodate the cooling fins 210 may be attached to the heat-dissipation base 10. At step S102, the cooling portion 200 including the heat-dissipation base 10, the cooling fins 210, and the cooling case 220 may be placed on the first jig 310, and subsequently at step S104, the heat-dissipation base 10 may be clamped.

At step S110, the first jig 310 and the second jig 320 are detached. The first jig 310 and the second jig 320 may be detached after the heat-dissipation base 10 has been cooled. Through these steps, bending of the semiconductor module 100 can be reduced.

Figure 7A:
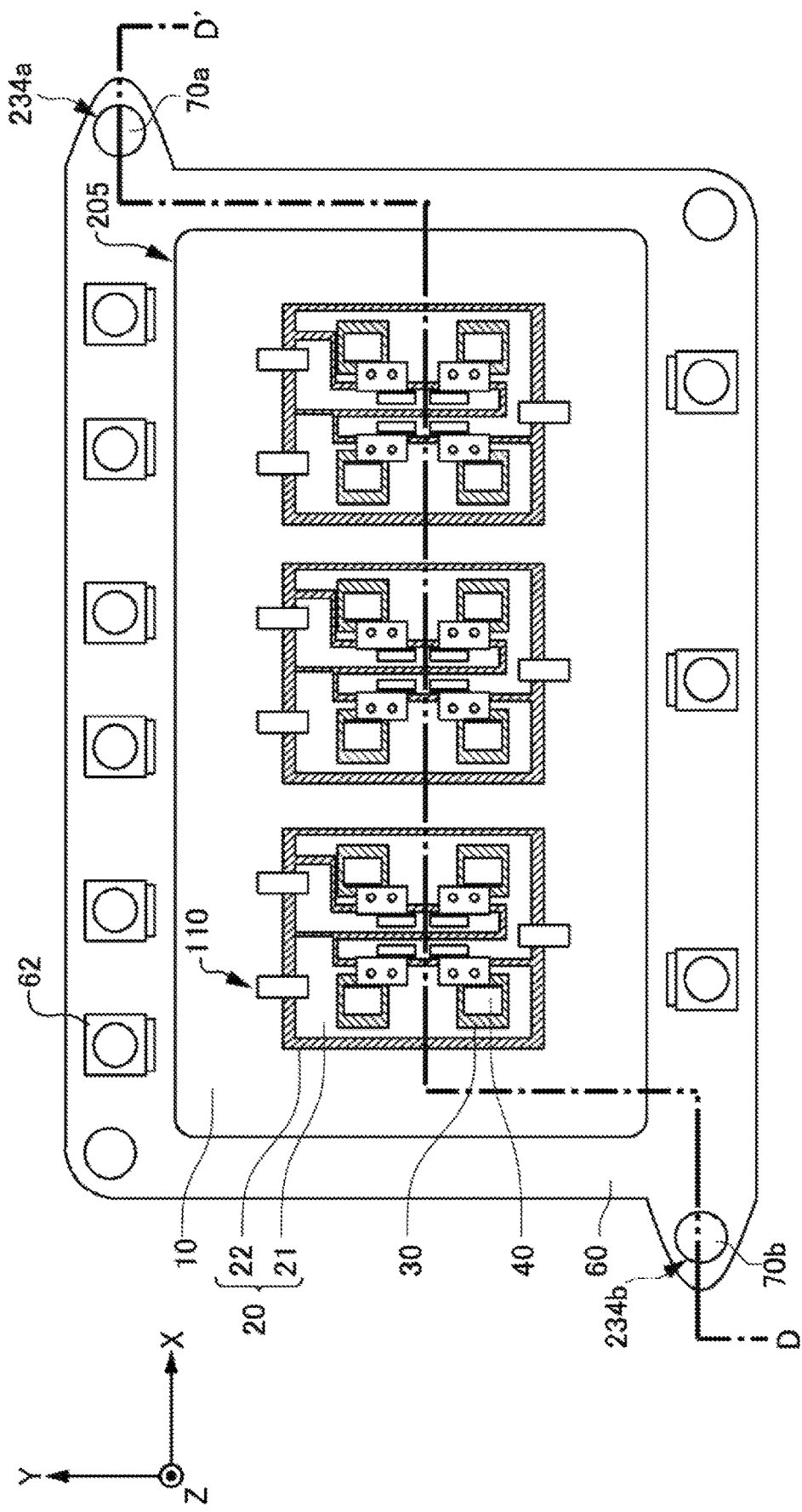
FIG. 7A is an exemplary plan view of the semiconductor module 100 according to another example of the present invention.

FIG. 7A is an exemplary plan view of the semiconductor module 100 according to another example of the present invention. In this example, differences from the semiconductor module 100 illustrated in FIG. 1A will be described in particular. The semiconductor module 100 according to this example includes the casing 60 having a different shape from that of the example illustrated in FIG. 1A. However, the shape of the casing 60 is not to be limited to this example.

Openings 234 are formed in end portions of the casing 60. The openings 234 are through holes extending through the casing 60, the heat-dissipation base 10, and the cooling case 220. The semiconductor module 100 according to this example has the two openings 234a and 234b.

Fasteners 70 are provided inside of the openings 234 and fasten the casing 60, the heat-dissipation base 10, and the cooling case 220 together. The fasteners 70 may be used to fix the semiconductor module 100 to an external apparatus. The semiconductor module 100 according to this example includes the two fasteners 70a and 70b. The fasteners 70a and 70b are respectively provided in the plurality of openings 234a and 234b.

Figure 7B:
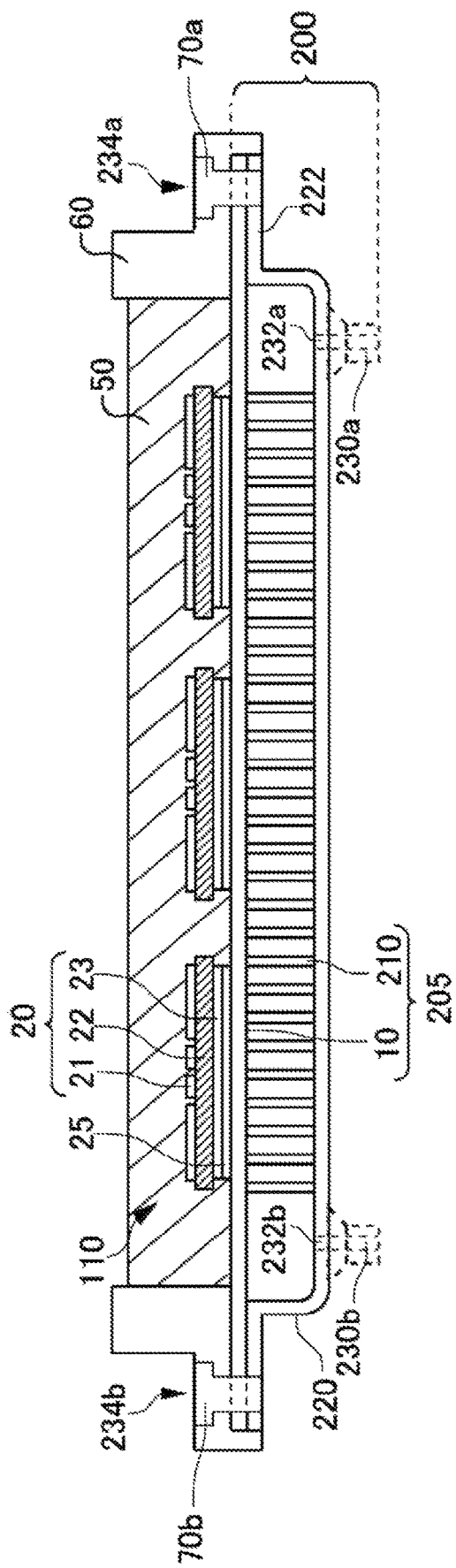
FIG. 7B is a view of an exemplary cross-section taken along line D-D' in FIG. 7A.

FIG. 7B is a view of an exemplary cross-section taken along line D-D' in FIG. 7A. The D-D' cross-section is a cross-section passing through the casing 60 and the semiconductor assemblies 110, and also passes through the opening 234a and the opening 234b.

The fasteners 70 fasten the casing 60, the heat-dissipation base 10, and the cooling case 220. In one example, the fasteners 70 are provided in regions where the heat-dissipation base 10 and the cooling case 220 are in close contact with each other directly or indirectly and overlap each other in the Z-axis direction and where the openings 234 are formed to extend through the heat-dissipation base 10 and the cooling case 220. The fasteners 70 make it easier to fix the cooling case 220 than in the example illustrated in FIG. 1B.

A frame 222 is provided on outer edges of the cooling case 220. The frame 222 surrounds the cooling fins 210 on an X-Y plane. The frame 222 may be a plate-shaped protrusion (namely, a flange) surrounding the outer edges of the cooling case 220. An upper surface of the plate-shaped protrusion may be parallel to the lower surface of the heat-dissipation base 10. The upper surface of the frame 222 is directly or indirectly in close contact with the lower surface of the heat-dissipation base 10. A sealing material or other material may be interposed between the upper surface of the frame 222 and the lower surface of the heat-dissipation base 10. As can be seen in FIG. 7B, the flange 222 protrudes outward from the top portions, which are nearest to the heat-dissipation base 10, of the side walls of the cooling case 220. As can be seen in FIG. 7B, the thickness of the portion of the heat-dissipation base 10 covering the cooling fins 210 and the thickness of the portion of the heat-dissipation base 10 covering the flange 222 of the cooling case 220 are the same.

Figure 8:
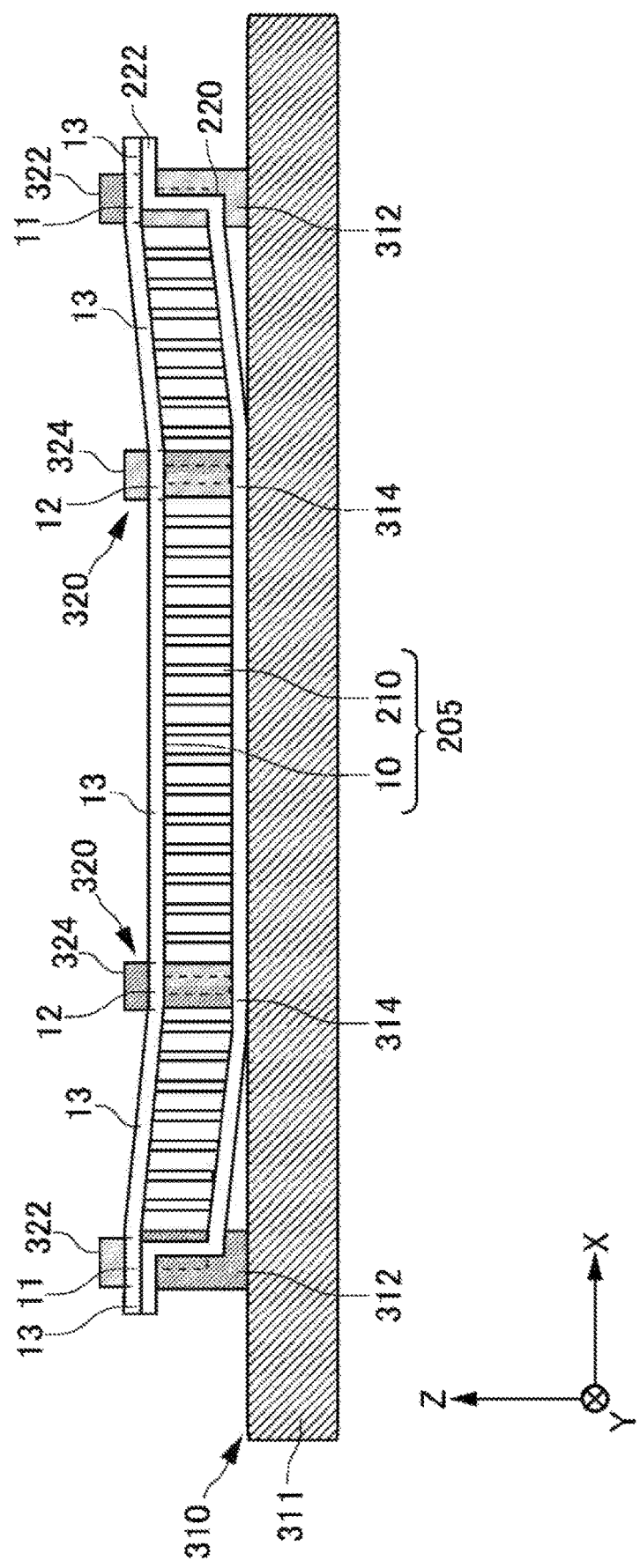
FIG. 8 is an exemplary side view of the heat-dissipation base 10 clamped by point-pressurization.

FIG. 8 is an exemplary side view of the heat-dissipation base 10 clamped by point-pressurization. The side view illustrates a state of the heat-dissipation base 10 being preliminarily bent. That is, this example is an example in which the fin-integrated base 205 is integral to the cooling case 220 at step S102 in FIG. 6. The fin-integrated base 205 is clamped while attached to the cooling case 220. Thus, the cooling case 220 is preliminarily bent in accordance with deformation of the fin-integrated base 205. Preliminary bending of the cooling case 220 facilitates reduction of bending of the finished product.

A configuration of the first jig 310 and the second jig 320 according to this example is an example of clamping the heat-dissipation base 10 by point-pressurization. The fin-integrated base 205 to which the cooling case 220 is attached may be clamped by plane-pressurization using the first jig 310 and the second jig 320 as illustrated in FIG. 4B.

Figure 9A:
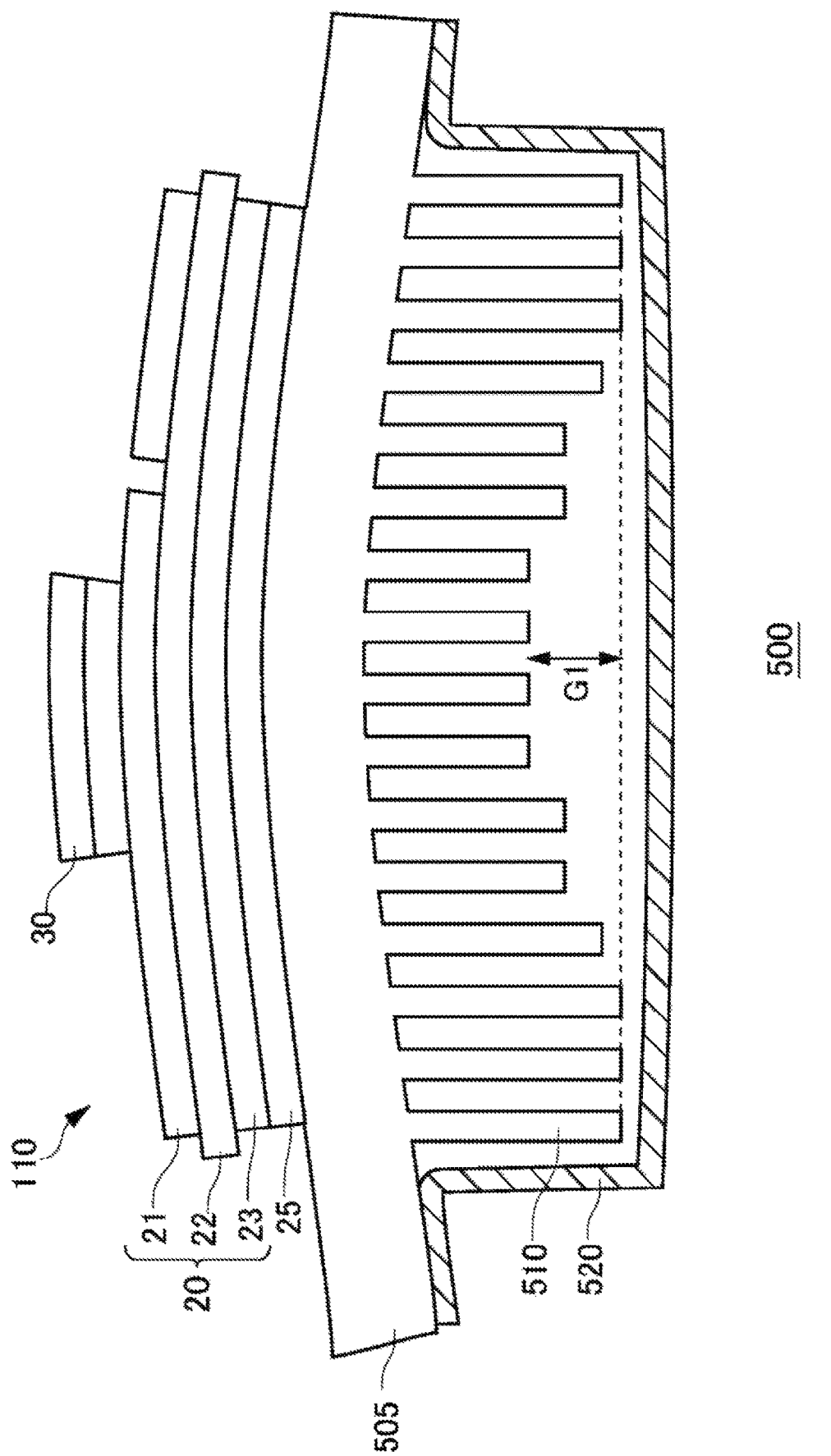
FIG. 9A is an exemplary cross-sectional view of a semiconductor module 500 manufactured by a method according to a comparative example.

FIG. 9A is an exemplary cross-sectional view of a semiconductor module 500 manufactured by a method according to a comparative example. To the semiconductor module 500 according to this comparative example, a cooling case 520 is not attached at the time of reflow. The cooling case 520 is attached after the reflow of the semiconductor assembly 110. Since a base substrate 505 is not bent preliminarily at an initial stage, the base substrate 505 is bent in a convex shape after the reflow. Bending of the base substrate 505 occurs owing to a difference between linear expansion coefficients of the base substrate 505 and the insulating substrate 20 while the base substrate 505 cools from a solder melting point to a room temperature.

A gap G1 is a difference in height of cooling fins 510 caused by the bending of the base substrate 505. Formation of the gap G1 increases an interval between the cooling fins 510 and the cooling case 520 so that a flowrate of coolant may change and degrade cooling performance in some cases. Although it may be considered to form the cooling case 520 in a shape that compensates for the bending of the base substrate 505, processing such a cooling case 520 takes time and labor, thereby increasing the cost.

FIG. 9B is an exemplary cross-sectional view of the semiconductor module 500 manufactured by a method according to another comparative example. To the semiconductor module 500 according to this comparative example, the cooling case 520 is attached at the time of reflow. The cooling case 520 may be integral to the base substrate 505. Since the base substrate 505 is not bent preliminarily at an initial stage, the base substrate 505 is bent in a convex shape after the reflow.

The semiconductor module 500 has a configuration of the cooling case 520 integral to the cooling fins 510. The cooling case 520 is bent in a convex shape after the reflow. The bent cooling case 520 may degrade efficiency of cooling other components provided on a rear surface of the semiconductor module 100 in some cases.

A gap G2 is a bending width of the cooling case 520 caused by the bending of the base substrate 505. Formation of the gap G2 hinders contact of the cooling case 520 with an external apparatus provided on a side opposite to the base substrate 505 side. This degrades efficiency of cooling the external apparatus by the cooling fins 510.

While the embodiments of the present invention have been described, the technical scope of the invention is not limited to the above-described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A semiconductor module comprising:
a fin-integrated base comprising a heat-dissipation base and a plurality of cooling fins projecting from the heat-dissipation base;
a semiconductor assembly provided on the heat-dissipation base on a side of the heat-dissipation base opposite the cooling fins;
a cooling case configured to accommodate the cooling fins, the cooling case comprising a bottom plate and side walls; and
coolant channels comprising openings provided in the bottom plate of the cooling case, the coolant channels being configured to run coolant inside of the cooling case via the openings,
wherein the cooling fins are located intermediate the heat-dissipation base and the bottom plate of the cooling case, wherein the heat-dissipation base has a portion covering the cooling fins and a portion covering the sidewalls of the cooling case, wherein the portion of the heat-dissipation base covering the cooling fins has a thickness and the portion of the heat-dissipation base covering the sidewalls of the cooling case has a thickness, wherein the thickness of the portion of the heat-dissipation base covering the cooling fins and the thickness of the portion of the heat-dissipation base covering the sidewalls of the cooling case are the same, wherein the heat-dissipation base is deformed convexly in cross section such that the heat-dissipation base is convex on the side of the heat-dissipation base opposite the cooling fins and such that the heat-dissipation base has a bending width, wherein the bending width of the heat-dissipation base is 200 μm or less, wherein assuming that an imaginary plane passes through a first end portion and a second end portion of the heat-dissipation base, wherein the second end portion is on a side opposite to the first end portion side in a longitudinal direction of the heat-dissipation base, wherein a center axis of each of the openings is deviated from a perpendicular line to the imaginary plane by 5 degrees or less, and
wherein the cooling case is deformed convexly such that the bottom plate of the cooling case protrudes toward the heat-dissipation base.

2. The semiconductor module according to claim 1, wherein the openings of the coolant channels are provided in end portions of the bottom plate of the cooling case in the longitudinal direction.

3. The semiconductor module according to claim 1, wherein the openings of the coolant channels comprise a first opening for allowing coolant into the cooling case and a second opening for allowing coolant out of the cooling case, wherein each of the first opening and the second opening is provided in a corresponding corner portion of the bottom plate of the cooling case, and wherein the corresponding corner portion of the bottom plate corresponding to the first opening is located diagonally across from the corresponding corner portion of the bottom plate corresponding to the second opening.

4. The semiconductor module according to claim 1, wherein the cooling case has outer edges, wherein the cooling case further comprises a flange protruding outward from the side walls of the cooling case and surrounding the outer edges of the cooling case, wherein the heat-dissipation base has a portion covering the flange, wherein the portion of the heat-dissipation base covering the flange has a thickness, and wherein the thickness of the portion of the heat-dissipation base covering the cooling fins and the thickness of the portion of the heat-dissipation base covering the flange of the cooling case are the same.

5. The semiconductor module according to claim 1, wherein the bottom plate of the cooling case is of uniform thickness.

6. A semiconductor module comprising:
a fin-integrated base comprising a heat-dissipation base and a plurality of cooling fins projecting from the heat-dissipation base, the heat-dissipation base being in the form of a metal plate of uniform thickness;
a semiconductor assembly provided on the heat-dissipation base on a side of the heat-dissipation base opposite the cooling fins, the heat-dissipation base having an upper surface on the side of the heat-dissipation base opposite the cooling fins, the semiconductor assembly being fixed to the upper surface of the heat-dissipation base by solder;
a cooling case configured to accommodate the cooling fins, the cooling case comprising a bottom plate and side walls; and
coolant channels comprising openings provided in the cooling case, the coolant channels being configured to run coolant inside of the cooling case via the openings,
wherein the heat-dissipation base is deformed convexly in cross section such that the heat-dissipation base is convex on the side of the heat-dissipation base opposite the cooling fins and such that the heat-dissipation base has a bending width, wherein the bending width of the heat-dissipation base is 200 μm or less, wherein assuming that an imaginary plane passes through a first end portion and a second end portion of the heat-dissipation base, wherein the second end portion is on a side opposite to the first end portion side in a longitudinal direction of the heat-dissipation base, wherein a center axis of each of the openings is deviated from a perpendicular line to the imaginary plane by 5 degrees or less, and
wherein the cooling case is deformed convexly such that the bottom plate of the cooling case protrudes toward the heat-dissipation base.

7. The semiconductor module according to claim 6, wherein the openings of the coolant channels provided in the cooling case are provided in the bottom plate of the cooling case,
wherein the cooling fins are located intermediate the heat-dissipation base and the bottom plate of the cooling case, and
wherein the openings of the coolant channels are provided in end portions of the bottom plate of the cooling case in the longitudinal direction.

8. The semiconductor module according to claim 6, wherein the openings of the coolant channels are provided in end portions of the bottom plate of the cooling case in the longitudinal direction.

9. The semiconductor module according to claim 7, wherein the openings of the coolant channels comprise a first opening for allowing coolant into the cooling case and a second opening for allowing coolant out of the cooling case, wherein each of the first opening and the second opening is provided in a corresponding corner portion of the bottom plate of the cooling case, and wherein the corresponding corner portion of the bottom plate corresponding to the first opening is located diagonally across from the corresponding corner portion of the bottom plate corresponding to the second opening.

10. The semiconductor module according to claim 6, wherein the cooling case has outer edges, wherein the cooling case further comprises a flange protruding outward from the side walls of the cooling case and surrounding the outer edges of the cooling case, wherein the heat-dissipation base has a portion covering the flange, wherein the portion of the heat-dissipation base covering the flange has a thickness, and wherein the thickness of the portion of the heat-dissipation base covering the cooling fins and the thickness of the portion of the heat-dissipation base covering the flange of the cooling case are the same.

11. The semiconductor module according to claim 6, wherein the bottom plate of the cooling case is of uniform thickness.

12. A semiconductor module comprising:
a fin-integrated base comprising a heat-dissipation base and a plurality of cooling fins projecting from the heat-dissipation base;
a semiconductor assembly, including an insulating plate, provided on the heat-dissipation base on a side of the heat-dissipation base opposite the cooling fins;
a cooling case configured to accommodate the cooling fins, the cooling case comprising a bottom plate and side walls; and
coolant channels comprising openings provided in the bottom plate of the cooling case, the coolant channels being configured to run coolant inside of the cooling case via the openings,
wherein the cooling fins are located intermediate the heat-dissipation base and the bottom plate of the cooling case, wherein the heat-dissipation base is deformed convexly in cross section such that the heat-dissipation base is convex on the side of the heat-dissipation base opposite the cooling fins and such that the heat-dissipation base has a bending width, wherein the bending width of the heat-dissipation base is 200 μm or less, wherein layers of material are provided between the insulating plate and the heat-dissipation base, wherein the layers of material extend in a stack from the insulating plate to the heat-dissipation base, wherein each of the layers of material consists of material selected from the group consisting of copper, copper alloys, and solder, wherein assuming that an imaginary plane passes through a first end portion and a second end portion of the heat-dissipation base, wherein the second end portion is on a side opposite to the first end portion side in a longitudinal direction of the heat-dissipation base, wherein a center axis of each of the openings is deviated from a perpendicular line to the imaginary plane by 5 degrees or less, and wherein the cooling case is deformed convexly such that the bottom plate of the cooling case protrudes toward the heat-dissipation base.

13. The semiconductor module according to claim 12, wherein the openings of the coolant channels are provided in end portions of the bottom plate of the cooling case in the longitudinal direction.

14. The semiconductor module according to claim 12, wherein the openings of the coolant channels comprise a first opening for allowing coolant into the cooling case and a second opening for allowing coolant out of the cooling case, wherein each of the first opening and the second opening is provided in a corresponding corner portion of the bottom plate of the cooling case, and wherein the corresponding corner portion of the bottom plate corresponding to the first opening is located diagonally across from the corresponding corner portion of the bottom plate corresponding to the second opening.

15. The semiconductor module according to claim 12, wherein the heat-dissipation base being in the form of a metal plate of uniform thickness.

16. The semiconductor module according to claim 15, wherein the heat-dissipation base having an upper surface on the side of the heat-dissipation base opposite the cooling fins, the semiconductor assembly being fixed to the upper surface of the heat-dissipation base by solder.

17. The semiconductor module according to claim 16, wherein the openings of the coolant channels are provided in end portions of the bottom plate of the cooling case in the longitudinal direction.

18. The semiconductor module according to claim 17, wherein the openings of the coolant channels comprise a first opening for allowing coolant into the cooling case and a second opening for allowing coolant out of the cooling case, wherein each of the first opening and the second opening is provided in a corresponding corner portion of the bottom plate of the cooling case, and wherein the corresponding corner portion of the bottom plate corresponding to the first opening is located diagonally across from the corresponding corner portion of the bottom plate corresponding to the second opening.

19. The semiconductor module according to claim 12, wherein the bottom plate of the cooling case is of uniform thickness.

20. A semiconductor module comprising:
a fin-integrated base comprising a heat-dissipation base and a plurality of cooling fins projecting from the heat-dissipation base;
a semiconductor assembly provided on the heat-dissipation base on a side of the heat-dissipation base opposite the cooling fins;
a cooling case configured to accommodate the cooling fins, the cooling case comprising a bottom plate and side walls; and
coolant channels comprising openings provided in the bottom plate of the cooling case, the coolant channels being configured to run coolant inside of the cooling case via the openings,
wherein the cooling fins are located intermediate the heat-dissipation base and the bottom plate of the cooling case, wherein the heat-dissipation base has a portion covering the cooling fins and a portion covering the sidewalls of the cooling case, wherein the portion of the heat-dissipation base covering the cooling fins has a thickness and the portion of the heat-dissipation base covering the sidewalls of the cooling case has a thickness, wherein the thickness of the portion of the heat-dissipation base covering the cooling fins and the thickness of the portion of the heat-dissipation base covering the sidewalls of the cooling case are the same, wherein a bending width of the heat-dissipation base is 200 µm or less, wherein assuming that an imaginary plane passes through a first end portion and a second end portion of the heat-dissipation base, wherein the second end portion is on a side opposite to the first end portion side in a longitudinal direction of the heat-dissipation base, a center axis of each of the openings is deviated from a perpendicular line to the imaginary plane by 5 degrees or less, wherein the cooling case is deformed convexly such that the bottom plate of the cooling case protrudes toward the heat-dissipation base, and wherein the cooling case is deformed convexly so that the coolant channels are inclined inward.

21. A semiconductor module comprising:

a fin-integrated base comprising a heat-dissipation base and a plurality of cooling fins projecting from the heat-dissipation base, the heat-dissipation base being in the form of a metal plate of uniform thickness;

a semiconductor assembly provided on the heat-dissipation base on a side of the heat-dissipation base opposite the cooling fins, the heat-dissipation base having an upper surface on the side of the heat-dissipation base opposite the cooling fins, the semiconductor assembly being fixed to the upper surface of the heat-dissipation base by solder;

a cooling case configured to accommodate the cooling fins, the cooling case comprising a bottom plate and side walls; and coolant channels comprising openings provided in the cooling case, the coolant channels being configured to run coolant inside of the cooling case via the openings, wherein the heat-dissipation base has a portion covering the cooling fins and a portion covering the sidewalls of the cooling case, wherein the portion of the heat-dissipation base covering the cooling fins has a thickness and the portion of the heat-dissipation base covering the sidewalls of the cooling case has a thickness, wherein the thickness of the portion of the heat-dissipation base covering the cooling fins and the thickness of the portion of the heat-dissipation base covering the sidewalls of the cooling case are the same, wherein a bending width of the heat-dissipation base is 200 µm or less, wherein assuming that an imaginary plane passes through a first end portion and a second end portion of the heat-dissipation base, wherein the second end portion is on a side opposite to the first end portion side in a longitudinal direction of the heat-dissipation base, a center axis of each of the openings is deviated from a perpendicular line to the imaginary plane by 5 degrees or less, wherein the cooling case is deformed convexly such that the bottom plate of the cooling case protrudes toward the heat-dissipation base, and wherein the cooling case is deformed convexly so that the coolant channels are inclined inward.

22. A semiconductor module comprising:

a fin-integrated base comprising a heat-dissipation base and a plurality of cooling fins projecting from the heat-dissipation base;

a semiconductor assembly, including an insulating plate, provided on the heat-dissipation base on a side of the heat-dissipation base opposite the cooling fins;

a cooling case configured to accommodate the cooling fins, the cooling case comprising a bottom plate and side walls; and coolant channels comprising openings provided in the bottom plate of the cooling case, the coolant channels being configured to run coolant inside of the cooling case via the openings, wherein the cooling fins are located intermediate the heat-dissipation base and the bottom plate of the cooling case, wherein a bending width of the heat-dissipation base is 200 µm or less, wherein layers of material are provided between the insulating plate and the heat-dissipation base, wherein the layers of material extend in a stack from the insulating plate to the heat-dissipation base, wherein each of the layers of material consists of material selected from the group consisting of copper, copper alloys, and solder, wherein assuming that an imaginary plane passes through a first end portion and a second end portion of the heat-dissipation base, wherein the second end portion is on a side opposite to the first end portion side in a longitudinal direction of the heat-dissipation base, a center axis of each of the openings is deviated from a perpendicular line to the imaginary plane by 5 degrees or less, wherein the cooling case is deformed convexly such that the bottom plate of the cooling case protrudes toward the heat-dissipation base, and wherein the cooling case is deformed convexly so that the coolant channels are inclined inward.

\* \* \* \* \*